United States Patent
Komori (10) Patent No.: US 7,903,224 B2
(45) Date of Patent: Mar. 8, 2011

(54) LIQUID CRYSTAL DISPLAY DEVICE

(75) Inventor: Fumiaki Komori, Isumi (JP)

(73) Assignee: Hitachi Displays, Ltd., Chiba-ken (JP)

( * ) Notice: Subject to any disclaimer, the term of this patent is extended or adjusted under 35 U.S.C. 154(b) by 509 days.

(21) Appl. No.: 11/896,367

(22) Filed: Aug. 31, 2007

(65) Prior Publication Data

US 2008/0062349 A1 Mar. 13, 2008

(30) Foreign Application Priority Data

Sep. 7, 2006 (JP) .................. 2006-242304

(51) Int. Cl.
*G02F 1/1345* (2006.01)
*G02F 1/1347* (2006.01)
(52) U.S. Cl. .......................................... 349/150; 349/74
(58) Field of Classification Search .................. 349/150, 349/74
See application file for complete search history.

(56) References Cited

U.S. PATENT DOCUMENTS 6,906,762 B1 6/2005 Witehira et al.
2004/0263759 A1* 12/2004 Matsuhira et al. ............ 349/151

FOREIGN PATENT DOCUMENTS

JP 3335998 7/1998
JP 2001-054144 4/2000

* cited by examiner

*Primary Examiner* — David Nelms
*Assistant Examiner* — Nathanael R Briggs
(74) *Attorney, Agent, or Firm* — Stites & Harbison, PLLC; Juan Carlos A. Marquez, Esq (57) ABSTRACT

To long sides of a front-side liquid crystal display panel and a rear-side liquid crystal display panel on the same side, elongated portions of flexible printed circuit boards having a substantially U-shape in a plan view are respectively connected by thermo-compression bonding. Due to such a constitution, when the front-side liquid crystal display panel and the rear-side liquid crystal display panel overlapping each other use the flexible printed circuit boards having the same specification, the flexible printed circuit boards can be easily pulled around and connected to a drive printed circuit board and, at the same time, can enhance a material cutting efficiency of flexible printed circuit boards, and can provide a liquid crystal display device at a low cost.

6 Claims, 10 Drawing Sheets

FIG. 16

LIQUID CRYSTAL DISPLAY DEVICE

CLAIM OF PRIORITY

The present application claims priority from Japanese Application JP 2006-242304 filed on Sep. 7, 2006, the content of which is hereby incorporated by reference into this application.

BACKGROUND OF THE INVENTION

1. Field of the Invention

The present invention relates to a liquid crystal display device, and more particularly to a liquid crystal display device which displays an image appearing stereoscopically by overlapping images displayed on two rear-side liquid crystal display panels which are arranged longitudinally in an overlapped manner.

2. Description of the Related Art

Patent document 1 discloses a technique which displays a three-dimensional stereoscopic image on a display screen without using special glasses or the like. In patent document 1, on a plurality of display screens having depth positions which differ from each other as viewed from a viewer, a two-dimensional image of an object to be displayed which is projected from the viewing direction of the viewer is formed. The formed two-dimensional image is displayed on a plurality of display screens having the depth positions which differ from each other as viewed from the viewer respectively, and the brightnesses of the displayed two-dimensional images are respectively independently changed for respective display screens thus forming the three-dimensional stereoscopic image.

Further, JP-A-2001-54144 (Japanese patent document 1) describes that, in this three dimensional display method, the transmissivities of two-dimensional images displayed on the respective display screens are respectively independently changed for respective display screens thus respectively independently changing the brightnesses of two-dimensional images displayed on the respective display screens.

Further, various proposals have been made with respect to the liquid crystal display device which performs the three-dimensional image display using the liquid crystal display panel. Japanese Patent 3335998 (Japanese Patent document 2) (U.S. Pat. No. 6,906,762) discloses one of such proposals in which two liquid crystal display panels overlap each other with a predetermined distance therebetween in the longitudinal direction to realize a three-dimensional image display based on the difference in parallax or the difference in motion between image data which are respectively supplied to the front-side liquid crystal display panel and the rear-side liquid crystal display panel. Patent document 2 discloses the three-dimensional image display in which the motion of the back scene data displayed on the rear-side liquid crystal display panel is small compared to the motion of front scene data displayed on the front-side liquid crystal display panel. Here, the arrangement of the front-side liquid crystal display panel and the rear-side liquid crystal display panel, the difference in motion between the back scene data and the front scene data, or both such arrangement and such difference is used as depth information for realizing the viewing of the three-dimensional image.

In this type of liquid crystal display device which overlaps two liquid crystal display panels with the predetermined distance therebetween in the longitudinal direction, a backlight is arranged on a back surface of two overlapped liquid crystal display panels and, further, display signals and drive signals for a power source and the like are supplied to two liquid crystal display panels from a drive-circuit-mounted printed circuit board which is mounted on the back surface. Here, by forming the printed circuit board using a single printed circuit board used in common by two liquid crystal display panels, the structure and the assembly of the liquid crystal display device can be simplified.

[Patent Document 1] JP-A-2001-54144
[Patent Document 2] Japanese Patent 3335998 (U.S. Pat. No. 6,906,762)

Figure 13:
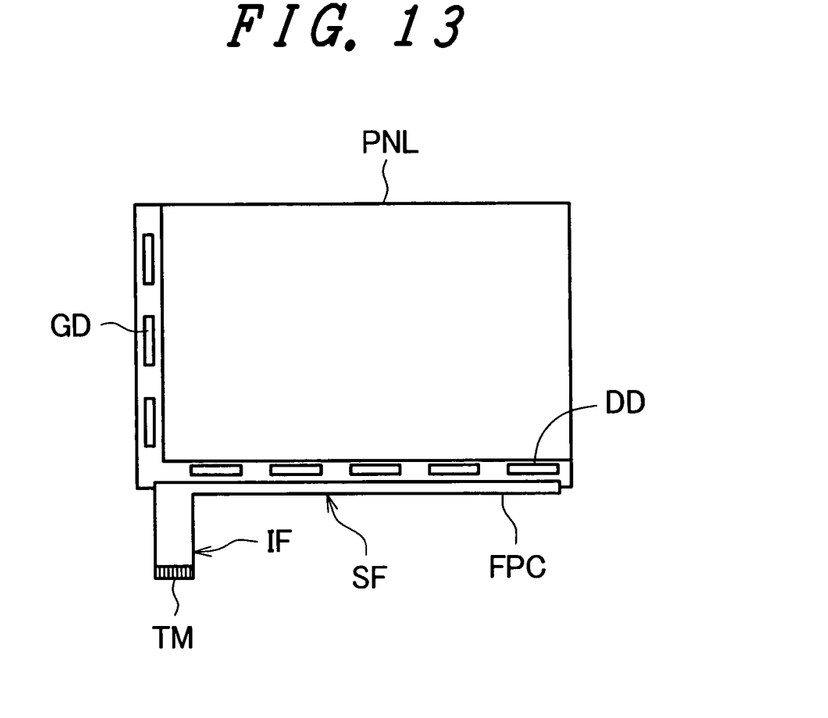
FIG. 13 is a plan view for explaining one mode of the flexible printed circuit board which is mounted on the liquid crystal display panel.
Figure 14A:
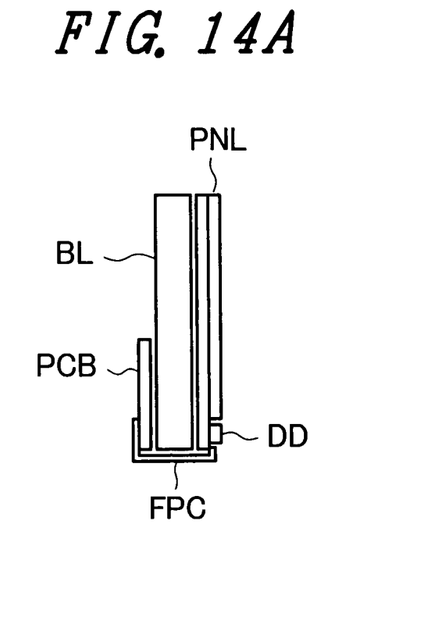
FIG. 14A and FIG. 14B are side views showing a state in which the liquid crystal display panel, a backlight and a drive printed circuit board are combined with each other and the liquid crystal display panels and the drive printed circuit board are connected with each other by the flexible printed circuit boards.
Figure 14B:
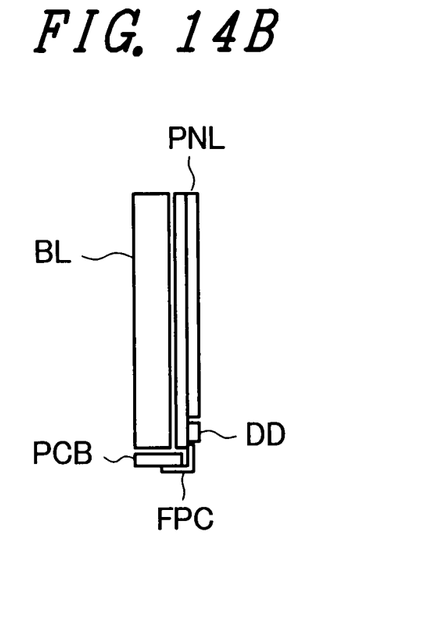

FIG. 13 is a plan view for explaining one mode of a flexible printed circuit board which is mounted on a liquid crystal display panel. FIG. 14A and FIG. 14B are side views showing a state in which the liquid crystal display panel, a backlight and a drive printed circuit board are combined with each other and the liquid crystal display panel and the drive printed circuit board are connected with each other by the flexible printed circuit board. As a method for supplying display signals and the like to the liquid crystal display panel PNL, that is, a method for driving the liquid crystal display panel PNL, a digital signal sequential transfer method (so-called data transfer method) is known as a mainstream drive method used currently. This method uses digital signals as the display signals. A plurality of data line drive circuit chips DD is mounted or formed on a long side of the liquid crystal display panel PNL, and a plurality of gate line drive circuit chips GD is mounted or formed on a short side of the liquid crystal display panel PNL.

The flexible printed circuit board FPC exhibits an L-shape in a plan view, wherein an elongated portion SF is mounted by thermo-compression bonding along the long side of the liquid crystal display panel PNL on which the data line drive circuit chips DD are mounted or formed by way of an anisotropic conductive films (ACF). A large-width portion (short-length portion) IF of the flexible printed circuit board FPC (a connecting portion for connecting the flexible printed circuit board FPC to the drive printed circuit board) has a width necessary for pulling around digital signal lines and power source lines, and is connected to the drive printed circuit board PCB. Here, the expression "large-width portion" implies that the large-width portion is a portion which is formed with a large width in general. In the liquid crystal display device shown in FIG. 14A in which the drive printed circuit board PCB is mounted on the back surface of the backlight, the large-width portion IF has a sufficient length necessary for wrapping around stacked side surfaces of the liquid crystal display panel and the backlight. Further, in the liquid crystal display device shown in FIG. 14B in which the drive printed circuit board PCB is mounted on the stacked side surfaces of the liquid crystal display panel and the backlight, the large-width portion IF is set shorter than the large-width portion IF shown in FIG. 14A.

In the liquid crystal display device which displays a stereoscopic image by overlapping two liquid crystal display panels with the predetermined distance therebetween in the longitudinal direction, it is indispensable to realize the common specification of parts for the reduction of cost and the prevention of erroneous assembling or the erroneous mounting of the flexible printed circuit board.

Figure 15A:
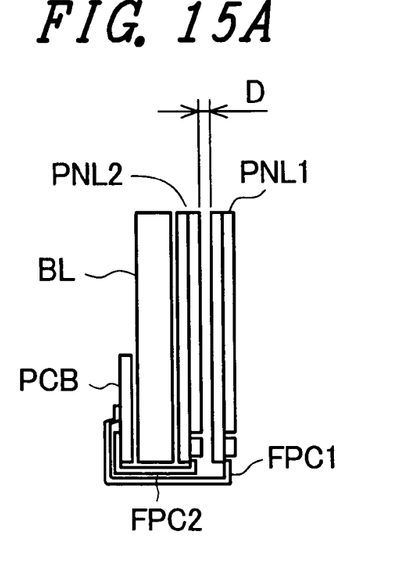
FIG. 15A and FIG. 15B are side views for explaining a drawback when the flexible printed circuit boards having the same specification are used for a twofold liquid crystal display panel.
Figure 15B:
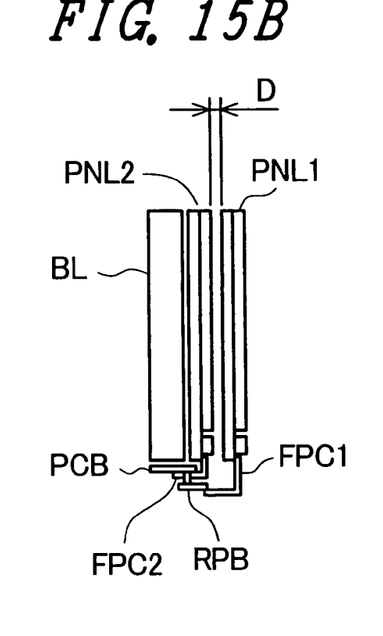

FIG. 15A and FIG. 15B are side views for explaining a drawback when the flexible printed circuit board having the same specification is used for a twofold liquid crystal display panel. A front-side liquid crystal display panel PNL1 and a rear-side liquid crystal display panel PNL2 are overlapped to each other with a predetermined distance D (for example, 6 mm) therebetween by interposing spacers not shown in the drawing, a backlight BL is stacked on a back surface of the rear-side liquid crystal display panel PNL2. In such structure, as a flexible printed circuit board FPC1 of the liquid crystal display panel PNL1 and a flexible printed circuit board FPC2 of the liquid crystal display panel PNL2, the flexible printed circuit board having an L-shape shown in FIG. 13 is used. Accordingly, when the drive printed circuit board PCB is mounted on the back surface of the backlight BL, it is necessary to make lengths of the large-width portions IF differ from each other as shown in FIG. 15A or it is necessary to displace positions at which the large-width portions IF of the elongated portions SF are formed from each other.

Further, when two liquid crystal display panels use a flexible printed circuit board of the same specification as the flexible printed circuit boards thereof, it is necessary to use a relay printed circuit board RPB or to slacken the flexible printed circuit board FPC1 as shown in FIG. 15B. Otherwise, it is necessary to displace the position at which the large-width portion IF of the elongated portion SF is formed.

Figure 16:
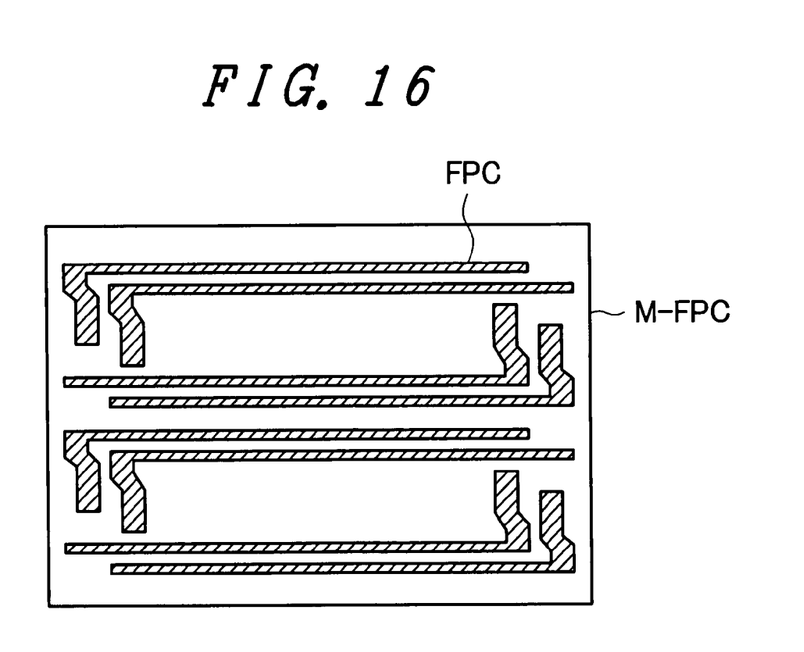
FIG. 16 is a view for explaining material cutting of the flexible printed circuit boards shown in FIG. 13.

Further, in adopting the flexible printed circuit board having the same specification, with the specification in which the flexible printed circuit board is formed in an L-shape as shown in FIG. 13, an allocating efficiency of the flexible printed circuit board, that is, a material cutting efficiency becomes low. FIG. 16 is a view for explaining material cutting of the flexible printed circuit boards shown in FIG. 13. When the L-shaped flexible printed circuit boards are allocated on a mother board sheet M-FPC, it is understood that many portions are wasted as shown in the drawing.

SUMMARY OF THE INVENTION

Accordingly, it is an object of the present invention to provide, at a low cost, a liquid crystal display device which can simplify the pull-around connection of a flexible printed circuit board to a drive printed circuit board when a flexible printed circuit board having the same specification is used for a front-side liquid crystal display panel and a rear-side liquid crystal display panel overlapped in the longitudinal direction and, at the same time, can enhance a material cutting efficiency of the flexible printed circuit board.

A liquid crystal display device of the present invention is a three-dimensional image display device which includes two liquid crystal display panels which are overlapped to each other in the longitudinal direction with a predetermined distance therebetween, and a drive printed circuit board which mounts a display control circuit thereon, the display control circuit being configured to supply display data inputted from the outside after the conversion of the display data into display signals to display parts of the above-mentioned two liquid crystal display panels for displaying images on the display parts, wherein a three-dimensional image is formed by overlapping a two-dimensional image displayed on the display part of the front-side liquid crystal display panel out of the above-mentioned two liquid crystal display panels and a two-dimensional image displayed on the display part of the rear-side liquid crystal display panel out of the above-mentioned two liquid crystal display panels.

In the present invention, the liquid crystal display device includes flexible printed circuit boards for transmitting the display signals to be supplied to two liquid crystal display panels which are connected between the drive printed circuit board and two respective liquid crystal display panels. Further, the drive printed circuit board is mounted on a back surface of the rear-side liquid crystal display panel.

The flexible printed circuit boards have the same specification with respect to the front-side and rear-side liquid crystal display panels, and the flexible printed circuit boards respectively include elongated portions which are connected along the same side corresponding to the front-side and rear-side liquid crystal display panels, and large-width portions which are folded in a U-shape at end portions of the elongated portions and extend along the elongated portions with a length shorter than a length of the elongated portion, and the large-width portions are folded in the thickness direction of the front-side and rear-side liquid crystal display panels, and terminal portions formed on one end portions of folded portions are connected to respective connectors formed on the printed circuit board mounted on a back surface of the rear-side liquid crystal display panel.

Further, the flexible printed circuit board of the present invention has the multi-layered structure which stacks a cover film on both front and rear surfaces thereof, and a linear peeling portion which is inclined with respect to a side of the liquid crystal display panel for ensuring the easiness of the folding is formed on at least one of front and rear cover films at a plurality of portions of the large-width portion. Although the inclination angle of the peeling portions is usually set to 45 degree, the inclination angle is not limited to 45 degree.

According to the present invention, the flexible printed circuit boards each of which has the elongated portion and the large-width portion which is folded in a U-shape a tone end portion of the elongated portion and extends with a length shorter than a length of the elongated portion along the elongated portion are provided. With the provision of such a flexible printed circuit boards, when the front-side liquid crystal display panel and the rear-side liquid crystal display panel which are overlapped to each other use the flexible printed circuit boards of the same specification, the present invention can enhance the tolerance in pulling the flexible printed circuit boards around the drive printed circuit board, can simplify the connection operation, can enhance a mounting (material cutting) efficiency of the flexible printed circuit boards, and can provide the liquid crystal display device at a low cost.

Further, electronic parts such as capacitors are mounted by soldering on the flexible printed circuit board before punching out the flexible printed circuit board from a mother board sheet. According to the present invention, by increasing the number of mounting parts per one single mother board sheet, a throughput of a solder mounting step of electronic parts can be enhanced leading to the reduction of a cost.

By making the folding positions of the front-side and rear-side liquid crystal display panels differ from each other, the large-width portions can be prevented from being overlapped to each other and hence, it is possible to displace the connection positions of the drive printed circuit board with the respective connectors from each other thus facilitating the connection operation and obviating the erroneous connection. Here, it is possible to obtain the substantially same advantageous effects also in mounting the drive printed circuit board on a side surface of the stacked structure of the liquid crystal display panel and the backlight.

DESCRIPTION OF THE PREFERRED EMBODIMENT

Hereinafter, a mode for carrying out the present invention is explained in detail in conjunction with drawings showing embodiments. In the embodiment of the present invention, the explanation is made with respect to a liquid crystal display device in which a front-side liquid crystal display panel is formed of a 9-type VGA type (640 pixels in the horizontal direction×480 pixels in the vertical direction, hereinafter, expressed as 640×480 pixels), and a rear-side liquid crystal display panel PNL2 is formed of a 9-type XGA type (1024× 768 pixels)

Embodiment 1

Figure 1:
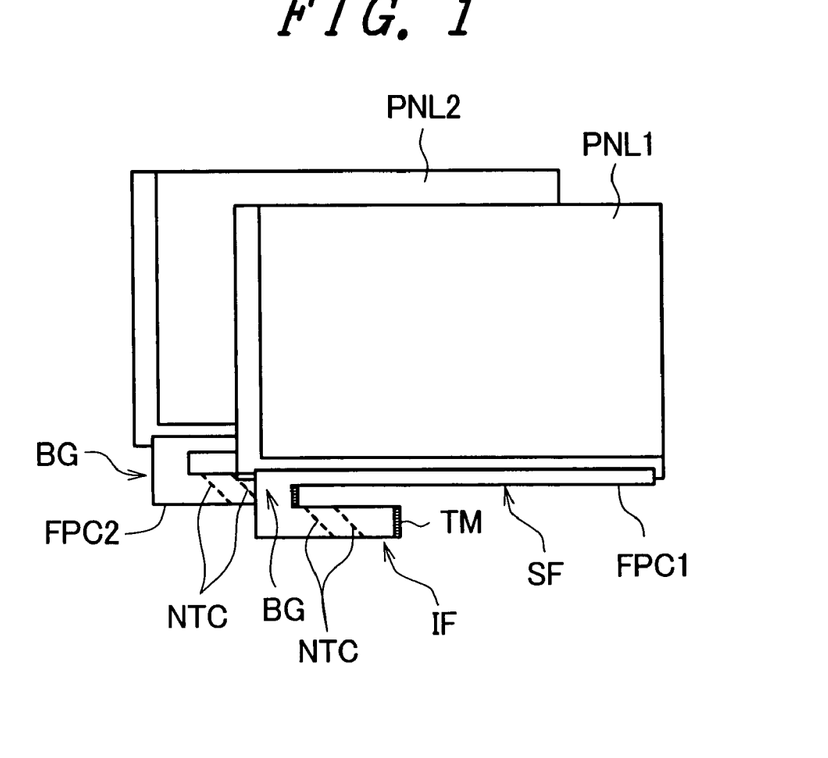
FIG. 1 is a view for explaining a connection state of liquid crystal display panels and a flexible printed circuit board for explaining the constitution of an embodiment 1 of a liquid crystal display device according to the present invention which adopts two liquid crystal display panels.

FIG. 1 is a view showing a state in which liquid crystal display panels and flexible printed circuit boards are connected with each other. FIG. 1 is provided for explaining the constitution of an embodiment 1 of a liquid crystal display device according to the present invention which adopts two liquid crystal display panels. In FIG. 1, the liquid crystal display device is configured such that the front-side liquid crystal display panel PNL1 and the rear-side liquid crystal display panel PNL2 overlap each other with a predetermined distance therebetween. To long sides of the front-side liquid crystal display panel PNL1 and the rear-side liquid crystal display panel PNL2 on the same side, elongated portions of flexible printed circuit boards FPC1, FPC2 having a substantially U-shape in a plan view are respectively connected by thermo-compression bonding. The flexible printed circuit boards FPC1, FPC2 have the same specification. On surfaces of the liquid crystal display panels to which the elongated portions are connected by thermo-compression bonding, terminals which are connected with drive circuit chips is formed by patterning. The drive circuit chips are not shown in the drawing.

The flexible printed circuit boards FPC1, FPC2 are folded in a U-shape at one ends of elongated portions SF to form large-width portions IF which extend along the elongated portions SF with a length thereof set shorter than a length of the elongated portions SF, and the connection terminals TM are formed on end portions of the large-width portions IF. The connection terminals TM are, as described later, connected to connectors mounted on the drive printed circuit board. Here, the connectors may be formed on the connection terminals TM.

The flexible printed circuit boards FPC1, FPC2 have the multi-layered wiring structure formed by stacking cover films on front and back surfaces thereof respectively. On at least one of the cover films of the front surface and the back surface of the large-width portion, a linear peeling portion NTC is formed at a plurality of positions for ensuring the easiness of folding. The linear peeling portion NTC is inclined with respect to a long side of the liquid crystal display panel. Although an inclination angle of the peeling portion NTC is usually set to 45 degree, the inclination angle may be set to other value corresponding to an arrangement position and a mounting angle of the connector formed on the drive printed circuit board. The linear peeling portion NTC may be formed of a single line such as a so-called perforated line or a continuous-groove-like line, a double line or a three double line. Further, the linear peeling portion NTC is not limited to the constitution which completely removes the cover film, and a thickness of the cover film corresponding to the peeling portion NTC may be reduced.

Figure 2:
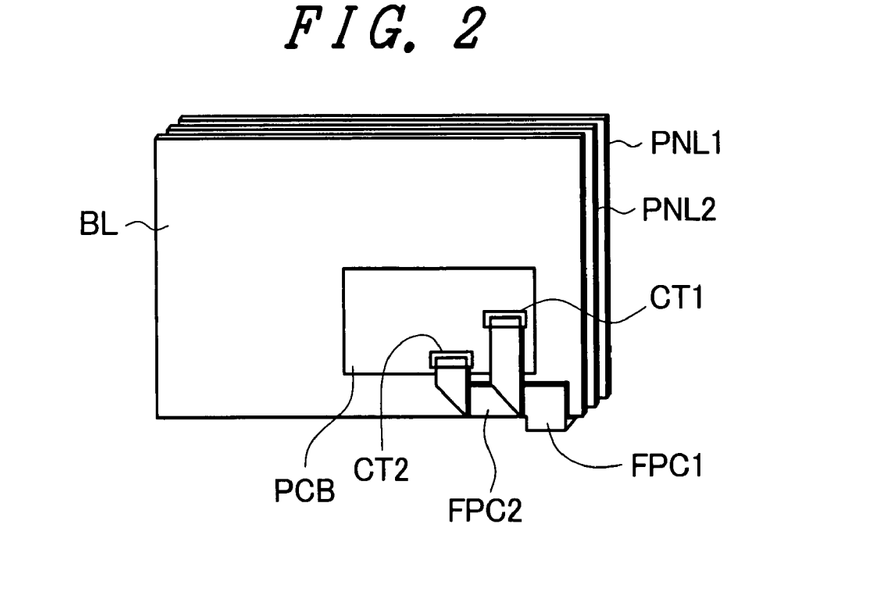
FIG. 2 is a view showing a back surface of the liquid crystal display device for explaining the embodiment 1 of the present invention.

FIG. 2 is a view showing a back surface of the liquid crystal display device for explaining the embodiment 1 of the present invention. In the liquid crystal display device shown in FIG. 2, a backlight BL is stacked on a back surface of the liquid crystal display device which is formed by overlapping the front-side liquid crystal display panel PNL1 and the rear-side liquid crystal display panel PNL2 with a predetermined distance therebetween. Further, a drive printed circuit board PCB is mounted on a back surface of the backlight. In FIG. 2, the flexible printed circuit board FPC2 of the rear-side liquid crystal display panel PNL2 is wrapped around the back surface of the backlight BL at a bridge portion BG which connects the elongated portion SF and the large-width portion IF with each other. Further, the large-width portion IF of the flexible printed circuit board FPC2 is folded at a position in the vicinity of the connector CT2 and is connected to the corresponding connector CT2.

In the same manner as the flexible printed circuit board FPC2, the flexible printed circuit board FPC1 of the front-side liquid crystal display panel PNL1 is wrapped around a back surface of the backlight BL at a bridge portion BG which connects the elongated portion SF and the large-width portion IF with each other. Further, the large-width portion IF of the flexible printed circuit board FPC2 is folded at the peeling portion NTC which is a portion away from the connector CT2 corresponding to the flexible printed circuit board FPC2, and is connected to the connector CT2. Here, the large-width portion IF of the flexible printed circuit board FPC1 is partially overlapped to the large-width portion IF of the flexible printed circuit board FPC2 of the rear-side liquid crystal display panel PNL2.

As described above, by displacing folded portions of the large-width portions IF of the flexible printed circuit board FPC1 and the flexible printed circuit board FPC2 from each other, the overlapping of the connectors on one drive printed circuit board is obviated, and the arrangement of the respective connectors can be arbitrarily set corresponding to a thickness of the stacked structure of the liquid crystal display panel and the backlight.

Figure 3A:
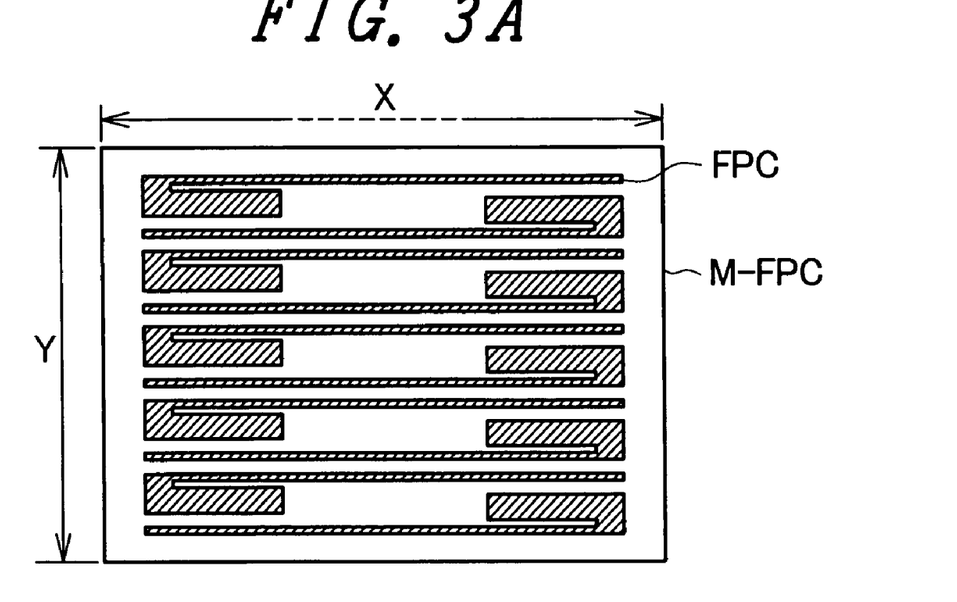
FIGS. 3A and 3B are schematic views for explaining an efficient material cutting of the flexible printed circuit board according to the present invention.
Figure 3B:
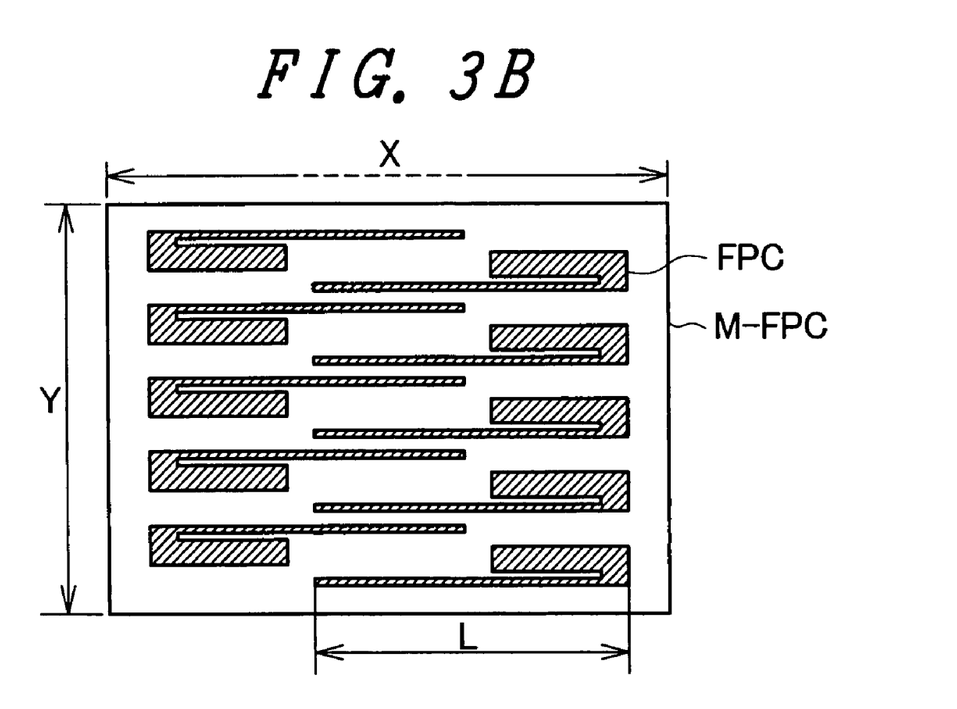

FIG. 3 is a schematic view for explaining an efficient material cutting of the flexible printed circuit board according to the present invention. When a motherboard sheet M-FPC having the same size as the mother board sheet explained in conjunction with FIG. 16 is used, although eight flexible printed circuit boards FPC can be obtained in FIG. 16, ten flexible printed circuit boards FPC can be obtained in FIG. 3A. Further, in FIG. 3B, fourteen flexible printed circuit boards FPC can be obtained. Still further, by fixing a width Y of the mother board sheet M-FPC and varying a length X of the mother board sheet M-FPC, various kinds of flexible printed circuit boards FPC which differ in a length L of the elongated portion from each other can be manufactured with a high material cutting efficiency.

According to the embodiment 1, with the use of the flexible printed circuit boards having the same specification for two liquid crystal display panels, the assembling operation of the panels can be simplified without errors and hence, it is possible to provide the liquid crystal display device at a low cost while enhancing the efficiency of the material cutting of the flexible printed circuit boards.

The embodiment 1 exemplifies a case in which two liquid crystal display panels which adopt a digital-signal sequential transfer method are arranged in an over lapped manner. The liquid crystal display panel may adopt a digital-signal bus-line method as a drive method of the liquid crystal display panel. Hereinafter, the explanation is made with respect to a constitutional example in which the present invention is applied to a liquid crystal display device which is formed by combining the liquid crystal display panel of the digital signal bus line method and the liquid crystal display panel of the digital signal sequential transfer method.

Figure 4:
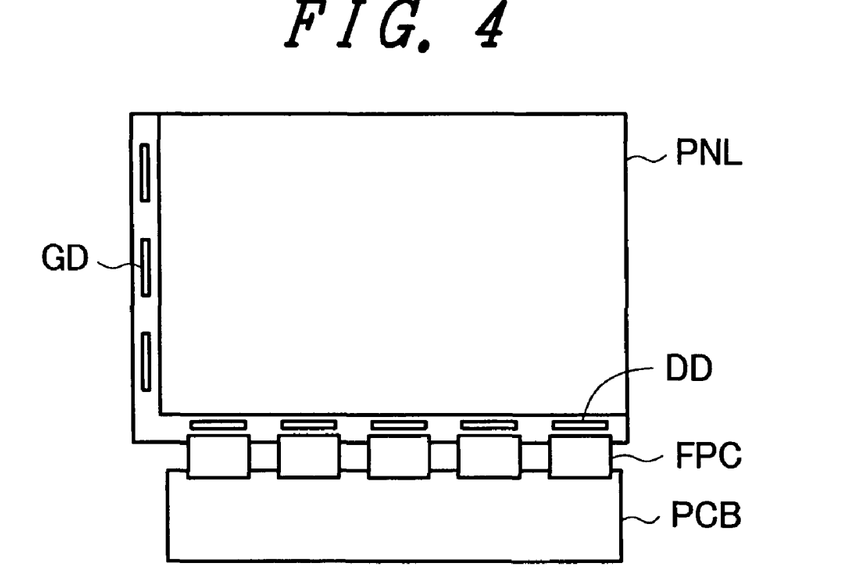
FIG. 4 is an explanatory view of the constitution in which a drive printed circuit board is connected to a liquid crystal display panel which adopts the digital signal bus line method using a plurality of flexible printed circuit boards.

FIG. 4 is an explanatory view of the constitution in which the drive printed circuit board is connected to the liquid crystal display panel of the digital signal bus line method using a plurality of flexible printed circuit boards. In this liquid crystal display panel, drain drivers DD are mounted on a long side of the liquid crystal display panel and gate drivers GD are mounted on a short side of the liquid crystal display panel. To the respective drain drivers DD mounted on the long side, display signals are supplied from the drive printed circuit board PCB via the short flexible printed circuit boards FPC.

Figure 5:
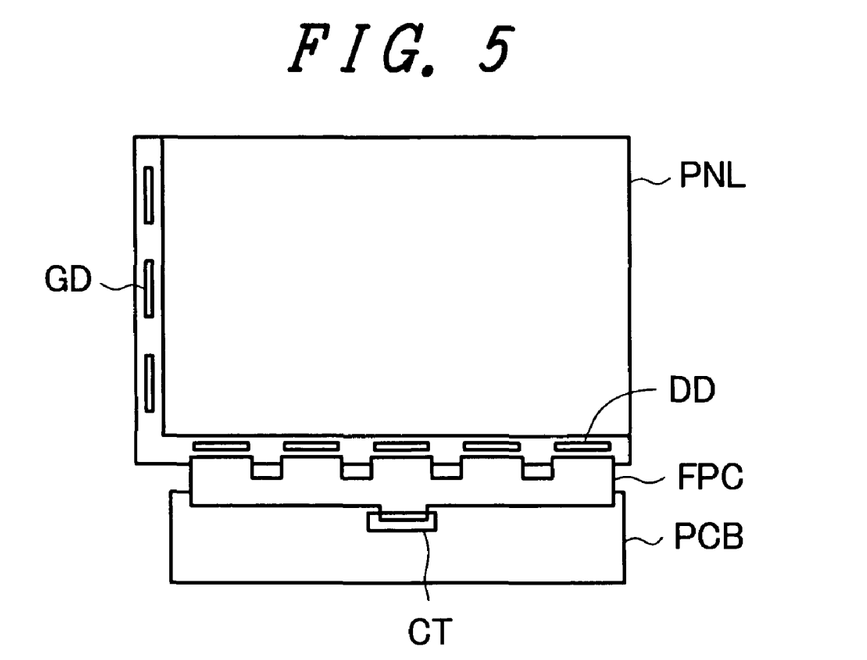
FIG. 5 is an explanatory view of the constitution in which the drive printed circuit board is connected to the liquid crystal display panel which adopts the digital signal bus line method using one flexible printed circuit board.

FIG. 5 is an explanatory view of the constitution in which the drive printed circuit board is connected to the liquid crystal display panel of the digital signal bus line method using one flexible printed circuit board. Also in this liquid crystal display panel, drain drivers DD are mounted on a long side of the liquid crystal display panel and gate drivers GD are mounted on a short side of the liquid crystal display panel. To the respective drain drivers DD mounted on the long side, display signals are supplied from the drive printed circuit board PCB via one flexible printed circuit board FPC which is connected to the drive printed circuit board PCB using a connector CT.

Figure 6:
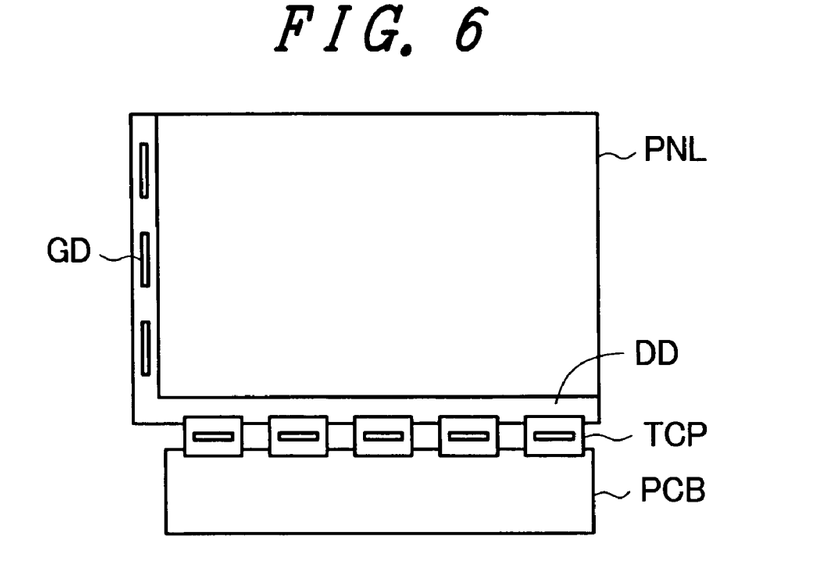
FIG. 6 is an explanatory view of the constitution in which the drive printed circuit board is connected to the liquid crystal display panel which adopts the digital signal bus line method using a plurality of tape carrier packages.

FIG. 6 is an explanatory view of the constitution in which the drive printed circuit board is connected to the liquid crystal display panel of the digital signal bus line method using a plurality of tape carrier packages. In this liquid crystal display panel, the plurality of tape carrier packages TCP each of which respectively mounts a drain driver DD thereon is used. Gate drivers GD are mounted on a short side of this liquid crystal display panel. The plurality of tape carrier packages TCP is respectively connected to drive printed circuit board PCB, and display signals are supplied to the liquid crystal display panel via the drain drivers DD which are respectively mounted on the tape carrier packages TCP.

Figure 7:
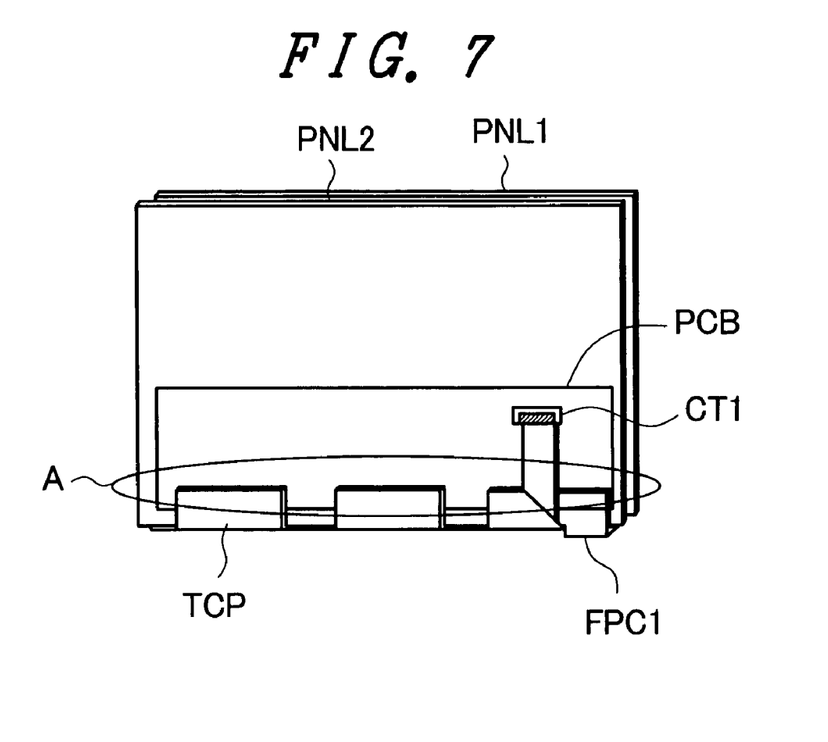
FIG. 7 is a view for explaining a drive signal supply method adopted by a liquid crystal display device which uses a liquid crystal display panel of a digital signal sequential transfer method similar to the liquid crystal display panel explained in conjunction with the embodiment 1 of the present invention as the front-side liquid crystal display panel and the liquid crystal display panel of the digital signal bus line method explained in conjunction with FIG. 4 as the rear-side liquid crystal display panel.

FIG. 7 is a view for explaining a drive signal supply method adopted by a liquid crystal display device which uses a liquid crystal display panel of a digital signal sequential transfer method similar to the liquid crystal display panel explained in conjunction with the embodiment 1 of the present invention as the front-side liquid crystal display panel and the liquid crystal display panel of the digital signal bus line method explained in conjunction with FIG. 6 as the rear-side liquid crystal display panel. Here, in FIG. 7, the backlight is omitted. Since lines which are connected to the respective drive circuit chips are arranged in the vicinity of an area A where the tape carrier packages TCP are connected to the drive printed circuit board PCB by thermo-compression bonding, the connector cannot be arranged. Accordingly, the large-width portion IF of the flexible printed circuit board FPC1 of the front-side liquid crystal display panel PNL1 is folded and is connected to the connector CT1 arranged on a side away from the area A of the drive printed circuit board PCB.

Figure 8:
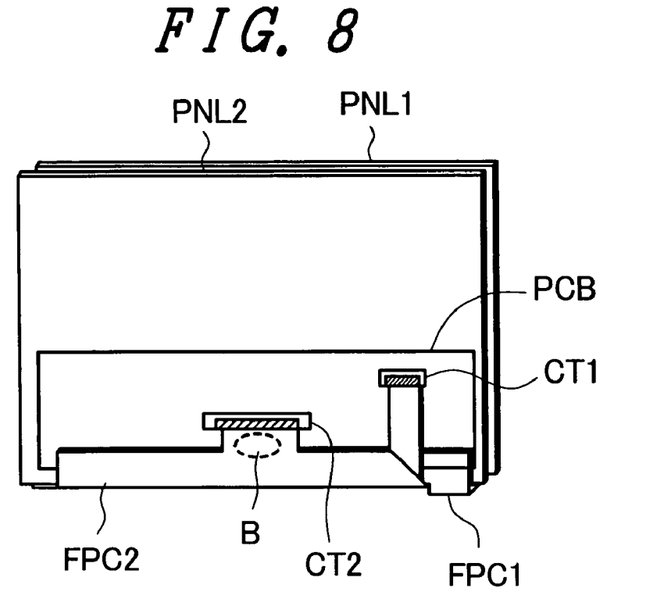
FIG. 8 is a view for explaining a drive signal supply method adopted by a liquid crystal display device which uses a liquid crystal display panel of a digital signal sequential transfer method similar to the liquid crystal display panel explained in conjunction with the embodiment 1 of the present invention as the front-side liquid crystal display panel and the liquid crystal display panel of the digital signal bus line method explained in conjunction with FIG. 5 as the rear-side liquid crystal display panel.

FIG. 8 is a view for explaining a drive signal supply method adopted by a liquid crystal display device which uses a liquid crystal display panel of a digital signal sequential transfer method similar to the liquid crystal display panel explained in conjunction with the embodiment 1 of the present invention as the front-side liquid crystal display panel and the liquid crystal display panel of the digital signal bus line method explained in conjunction with FIG. 5 as the rear-side liquid crystal display panel. Here, also in FIG. 8, the backlight is omitted. The flexible printed circuit board FPC2 to be connected to the drive printed circuit board PCB forms a large-width portion in the vicinity of the center of an elongated portion thereof and is connected to a connector CT2 at a center portion of the drive printed circuit board PCB. Lines which are connected with respective drive circuit chips are concentrated at a connection portion indicated by symbol B in the drawing where the flexible printed circuit board FPC2 and the connector CT2 are connected with each other and hence, the connector CT becomes large-sized. Accordingly, it is inevitably necessary to arrange the connector CT1 at a position similar to the position explained in conjunction with FIG. 7. A large-width portion IF of the flexible printed circuit board FPC1 of the front-side liquid crystal display panel PNL1 is folded, and is connected to the connector CT1 arranged on a side away from the area A.

Figure 9:
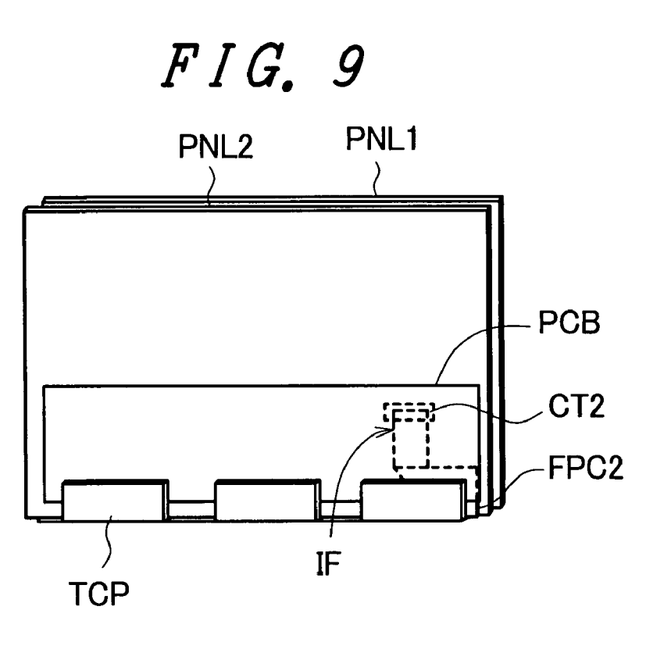
FIG. 9 is a view for explaining a drive signal supply method adopted by a liquid crystal display device which uses a liquid crystal display panel of a digital signal sequential transfer method similar to the liquid crystal display panel explained in conjunction with the embodiment 1 of the present invention as the rear-side liquid crystal display panel and the liquid crystal display panel of the digital signal bus line method explained in conjunction with FIG. 6 as the front-side liquid crystal display panel.

FIG. 9 is a view for explaining a drive signal supply method adopted by a liquid crystal display device which uses a liquid crystal display panel of a digital signal sequential transfer method similar to the liquid crystal display panel explained in conjunction with the embodiment 1 of the present invention as the rear-side liquid crystal display panel and the liquid crystal display panel of the digital signal bus line method explained in conjunction with FIG. 6 as the front-side liquid crystal display panel. Also in FIG. 9, the backlight is omitted. Lines which are connected with respective drive circuit chips are arranged in the vicinity of regions of a drive printed circuit board PCB to which tape carrier packages TCP are connected by thermo-compression bonding and hence, connectors cannot be arranged in the same manner as the constitution shown in FIG. 7. Accordingly, a large-width portion IF of a flexible printed circuit board FPC2 of the rear-side liquid crystal display panel PNL2 is folded, and is connected to a connector CT2 which is arranged on a side away from the connection region of the tape carrier package TCP on an inner side of the drive printed circuit board PCB (a surface which faces the rear-side liquid crystal display panel in an opposed manner).

Figure 10:
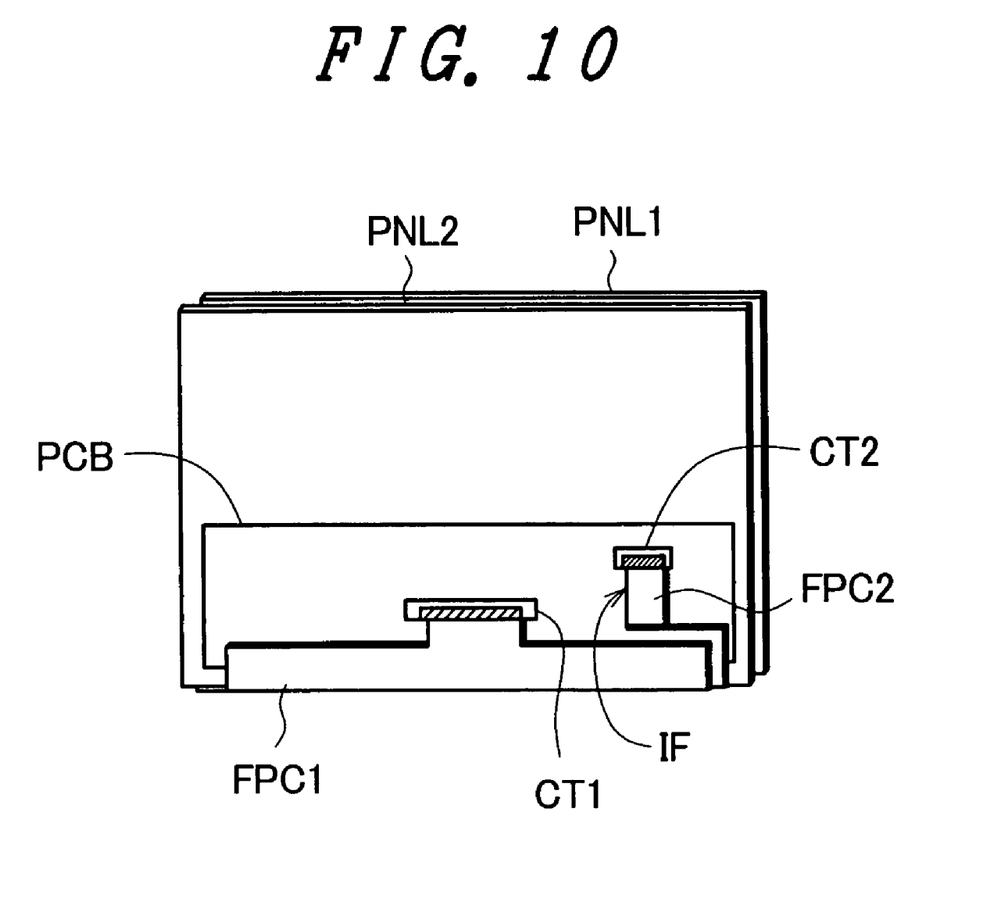
FIG. 10 is a view for explaining a drive signal supply method adopted by a liquid crystal display device which uses a liquid crystal display panel of a digital signal sequential transfer method similar to the liquid crystal display panel explained in conjunction with the embodiment 1 of the present invention as the rear-side liquid crystal display panel and the liquid crystal display panel of the digital signal sequential transfer method having a flexible printed circuit board explained in conjunction with FIG. 5 as the front-side liquid crystal display panel.

FIG. 10 is a view for explaining a drive signal supply method adopted by a liquid crystal display device which uses a liquid crystal display panel of a digital signal sequential transfer method similar to the liquid crystal display panel explained in conjunction with the embodiment 1 of the present invention as the rear-side liquid crystal display panel and the liquid crystal display panel of the digital signal sequential transfer method having a flexible printed circuit board explained in conjunction with FIG. 5 as the front-side liquid crystal display panel. Here, also in FIG. 10, the backlight is omitted. The flexible printed circuit board FPC1 of the front-side liquid crystal display panel PNL1 forms a large-width portion in the vicinity of the center of an elongated portion thereof, and the flexible printed circuit board FPC1 is connected to a connector CT1 at a center portion of the drive printed circuit board PCB. Lines which are connected with respective drive circuit chips are concentrated on a connection portion of the flexible printed circuit board FPC1 with the connector CT1 and hence, the connector CT1 becomes large-sized. Accordingly, it is inevitably necessary to arrange the connector CT1 at a position similar to the position explained in conjunction with FIG. 8. A large-width portion IF of the flexible printed circuit board FPC2 of the rear-side liquid crystal display panel PNL2 is folded, and is connected to a connector CT2 arranged on a side away from the connector CT1.

Figure 11:
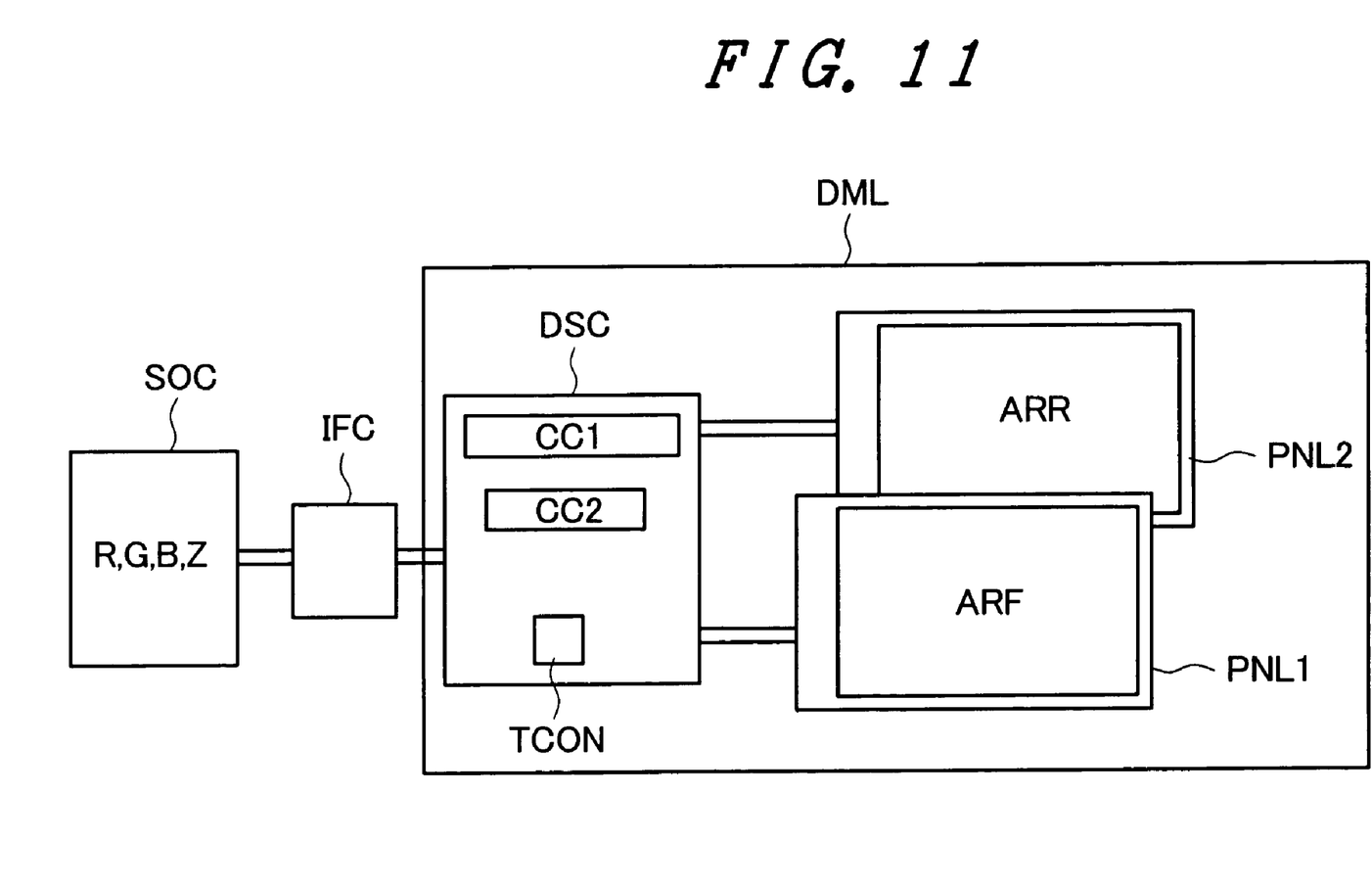
FIG. 11 is a view for explaining a whole constitution of the embodiment 1 of a three-dimensional image display device according to the present invention which adopts two liquid crystal display panels.

FIG. 11 is a view for explaining an example of the whole constitution of the liquid crystal display device for performing the three-dimensional image display according to the present invention which is constituted by overlapping two liquid crystal display panels longitudinally. In FIG. 11, symbol SOC indicates an external signal source, symbol IFC indicates an interface circuit, and symbol DML indicates a display module. Display data inputted from the external signal source SOC is formed of respective grayscale signals R, G, B of three colors consisting of red, green and blue and depth information Z. The display data is inputted into a drive circuit DSC of a display module DML through the interface circuit IFC. The drive circuit DSC is mounted on the above-mentioned drive printed circuit board PCB. The display module DML includes a two-screen display signal generating circuit CC1 which develops the respective grayscale signals R, G, B of three colors and depth information Z into two systems consisting of the display signals of three colors of red, green and blue for displaying an image on a display part ARF of the front-side liquid crystal display panel PNL1 and the display signals of three colors of red, green and blue for displaying an image on a display part ARR of the rear-side liquid crystal display panel PNL2, a definition conversion circuit CC2 which converts the resolution of the display signals of three colors of red, green and blue for displaying an image on the display part ARR of the rear-side liquid crystal display panel PNL2, and a timing controller TCON which generates display timing of the display part ARF of the front-side liquid crystal display panel PNL1 and the display part ARR of the rear-side liquid crystal display panel PNL2.

Each one of the respective display data signals (grayscale signals) R, G, B of three colors and depth information Z inputted from the external signal source SOC is typically of formed of 6 bits. In the display control part DSC, the display signals R, G, B which are given to the front-side liquid crystal display panel PNL1 and the rear-side liquid crystal display panel PNL2 respectively based on the inputted R, G, B and Z are computed and allocated. Further, the display data to the rear-side liquid crystal display panel PNL2 of high definition has the definition thereof converted by the definition conversion circuit CC2 (scaler). The conversion of the definition is performed by a bi-linear method, for example.

Further, in this embodiment, the display data inputted from the external signal source SOC is VGA and hence, the display data is as same as the display data of the front-side liquid crystal display panel PNL1. Accordingly, the definition conversion circuit CC2 performs the conversion of the display signal to the rear-side liquid crystal display panel PNL2 from VGA to XGA.

Figure 12:
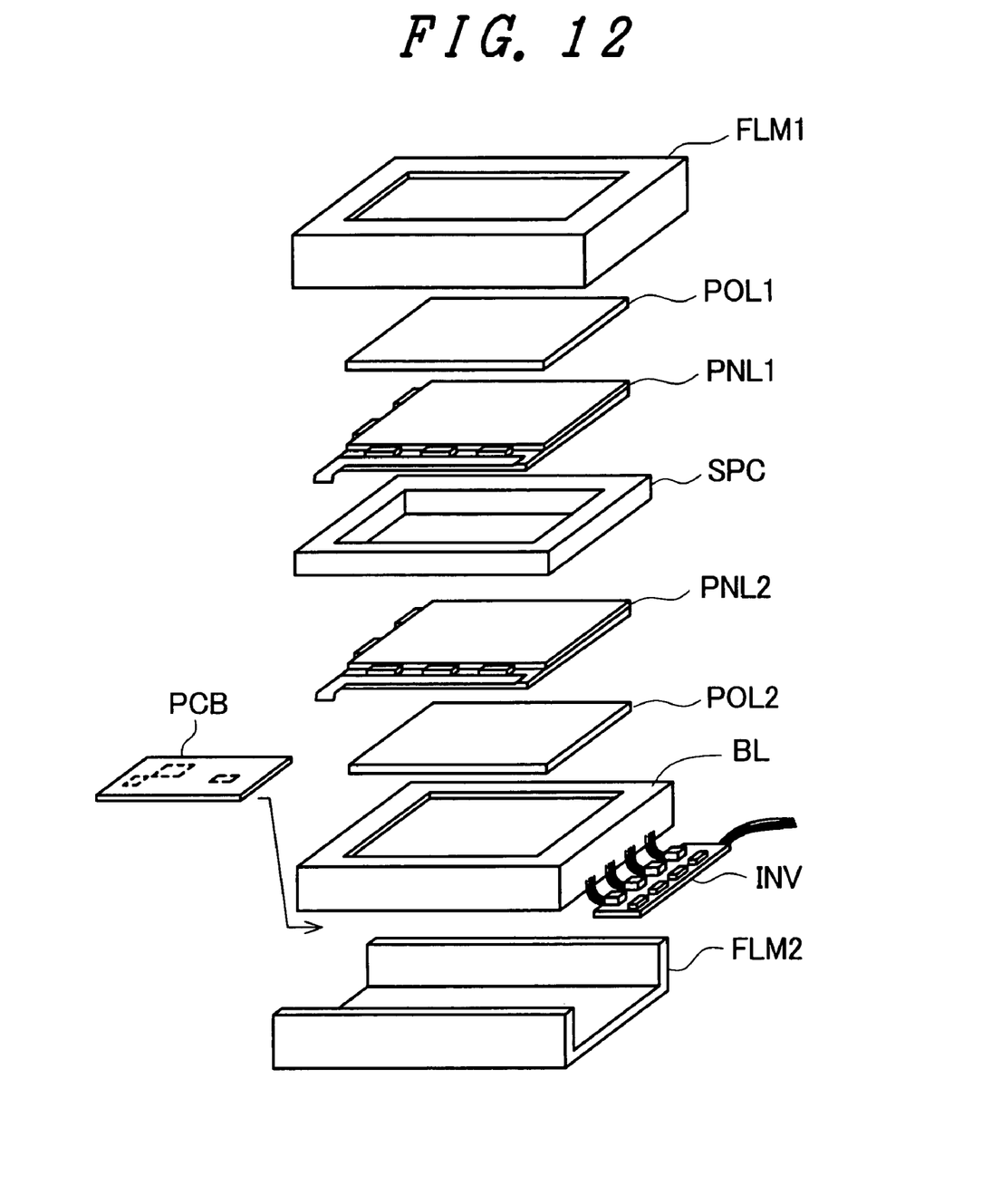
FIG. 12 is a developed perspective view for explaining a constitutional example of the three-dimensional image display device which displays a stereoscopically image by overlapping two liquid crystal display panels longitudinally in the vertical direction as viewed from a viewer's side.

FIG. 12 is a developed perspective view for explaining an example of assembly of the liquid crystal display device for performing a stereoscopic image display by over lapping two liquid crystal display panels longitudinally in the vertical direction as viewed from a viewer's side. In the liquid crystal display device, the front-side liquid crystal display panel PNL1 and the rear-side liquid crystal display panel PNL2 overlap each other with a predetermined distance therebetween by way of spacers SPC. A polarization film POL1 is adhered to a surface of the front-side liquid crystal display panel PNL1, and a polarization film POL2 is adhered to a back surface of the rear-side liquid crystal display panel PNL2.

Further, a backlight (illumination device) BL is arranged on a back surface of the rear-side liquid crystal display panel PNL2, and a drive printed circuit board PCB is arranged on a back surface of the backlight BL. Then, the whole display device is wrapped by a lower frame FLM2 and an upper frame FLM1 thus constituting an integral display module. Further, in the liquid crystal display device, the backlight BL is formed of one or a plurality of cold cathode fluorescent lamps, and the backlight BL includes an inverter INV which supplies a drive current to the cold cathode fluorescent lamps. Here, such a backlight may be also formed of a light emitting diode array.

What is claimed is:

1. A liquid crystal display device which arranges a front-side liquid crystal display panel and a rear-side liquid crystal display panel in an overlapped manner with a predetermined distance therebetween, comprising:
   a drive printed circuit board which mounts a display control circuit thereon, the display control circuit being configured to supply display data inputted from an external source after conversion of the display data into display signals to respective display parts of the front-side and rear-side liquid crystal display panels for displaying images on the respective display parts, and
   flexible printed circuit boards for transmitting the display signals to be supplied to the front-side and rear-side liquid crystal display panels which are connected between the drive printed circuit board and the respective front-side and rear-side liquid crystal display panels, wherein
   the drive printed circuit board is mounted on a back surface of the rear-side liquid crystal display panel,
   the flexible printed circuit boards have matching outlines with respect to the front-side and rear-side liquid crystal display panels, and the flexible printed circuit boards include elongated portions which are connected along a same side corresponding to the front-side and rear-side liquid crystal display panels, and large-width portions which are folded in a U-shape at end portions of the elongated portions and extend along the elongated portions with a length shorter than a length of the elongated portions, and
   the large-width portions are folded in a thickness direction of the front-side and rear-side liquid crystal display panels, and terminal portions formed on end portions of the folded portions are connected to respective connectors formed on the drive printed circuit board mounted on the back surface of the rear-side liquid crystal display panel.

2. A liquid crystal display device according to claim 1, wherein the flexible printed circuit board has the multi-layered structure which stacks a cover film on both front and rear surfaces thereof, and
   a linear peeling portion which is inclined with respect to a side of the liquid crystal display panel for ensuring the easiness of the folding is formed on at least one of front and rear cover films at a plurality of portions of the large-width portion.

3. A liquid crystal display device according to claim 2, wherein the respective flexible printed circuit boards which have the respective elongated portions thereof connected to the front-side and rear-side liquid crystal display panels have the folded linear peeling portions which are differ from each other.

4. A liquid crystal display device according to claim 1, wherein a three-dimensional image is formed by overlapping two-dimensional images displayed on respective display parts of the front-side and rear-side liquid crystal display panels.

5. A liquid crystal display device according to claim 2, wherein a three-dimensional image is formed by overlapping two-dimensional images displayed on respective display parts of the front-side and rear-side liquid crystal display panels.

6. A liquid crystal display device according to claim 3, wherein a three-dimensional image is formed by overlapping two-dimensional images displayed on respective display parts of the front-side and rear-side liquid crystal display panels.

* * * * *